United States Patent [19]

Satou et al.

[11] 4,168,442
[45] Sep. 18, 1979

[54] CMOS FET DEVICE WITH ABNORMAL CURRENT FLOW PREVENTION

[75] Inventors: Kazuo Satou, Yokohama; Mitsuhiko Ueno, Fujisawa; Yasoji Suzuki, Kanagawa, all of Japan

[73] Assignee: Tokyo Shibaura Electric Co., Ltd., Japan

[21] Appl. No.: 908,661

[22] Filed: May 23, 1978

Related U.S. Application Data

[63] Continuation of Ser. No. 705,998, Jul. 16, 1976, abandoned.

[30] Foreign Application Priority Data

Jul. 18, 1975 [JP] Japan ................ 50-87910
Jul. 18, 1975 [JP] Japan ................ 50-87914

[51] Int. Cl.² ............ H03K 3/353; H03K 17/16; H03K 17/60; H01L 29/78
[52] U.S. Cl. ............ 307/304; 307/200 B; 307/213; 307/251; 357/42; 328/167
[58] Field of Search ........ 307/205, 213, 214, 304, 307/200 B, 251; 328/165, 167, 263; 361/110

[56] References Cited

U.S. PATENT DOCUMENTS

| | | | |
|---|---|---|---|
| 3,601,625 | 8/1971 | Redwine et al. | 307/304 X |
| 3,636,385 | 1/1972 | Koepp | 307/200 B X |
| 3,665,218 | 5/1972 | Andrews, Jr. | 307/200 B X |
| 3,712,995 | 1/1973 | Steudel | 307/304 |
| 3,862,441 | 1/1975 | Nabetani et al. | 307/304 X |
| 3,934,159 | 1/1976 | Nomiya et al. | 307/304 |
| 3,955,210 | 5/1976 | Bhatia et al. | 357/42 |
| 3,967,295 | 6/1976 | Stewart | 307/304 X |
| 4,015,147 | 3/1977 | Davidson et al. | 357/42 X |

OTHER PUBLICATIONS

Dennehy, "Non-Latching Integrated Circuits"; *RCA Technical Notes* (pub.) TN No.: 876; 2/12/71; 4 pp.
Staples, "Electrical Noise Spike Suppression"; *IBM Tech. Discl. Bull.*; vol. 15, No. 10, p. 3208; 3/73.
Clapper, "Bandpass Filter Using Differential Amplifier", *IBM Tech. Discl. Bull.*; vol. 14, No. 3, pp. 815–816, 8/71.

*Primary Examiner*—Larry N. Anagnos
*Attorney, Agent, or Firm*—Finnegan, Henderson, Farabow & Garrett

[57] ABSTRACT

A CMOS FET device which comprises an N type semiconductor substrate; a P type well layer formed in the N type semiconductor substrate; a p-channel type MOS transistor provided in the N type semiconductor substrate; an n-channel type MOS transistor formed in the P type well layer; and a noise-absorbing capacitor provided at the input or output terminal of the MOS transistor or at a power supply section.

1 Claim, 7 Drawing Figures

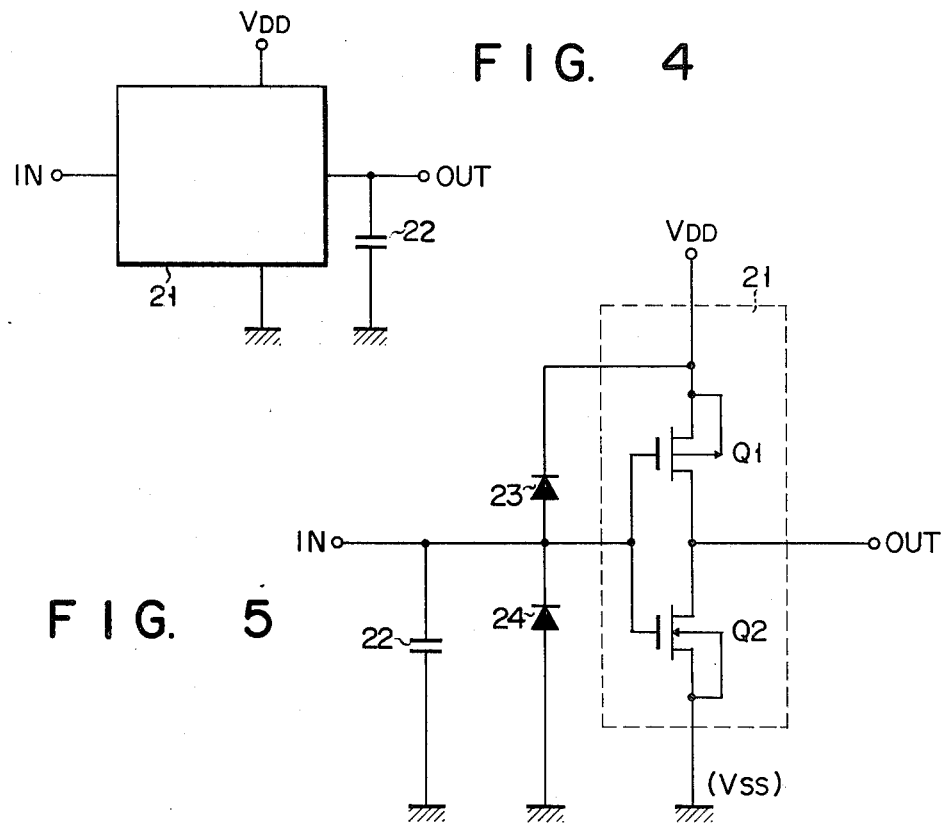
FIG. 4
FIG. 5
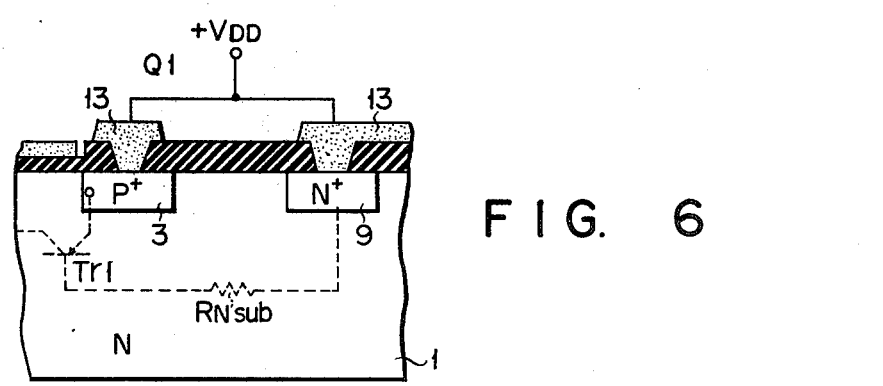
FIG. 6
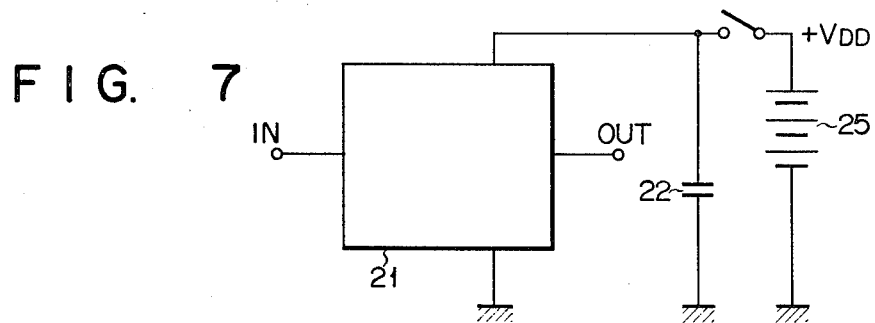
FIG. 7

CMOS FET DEVICE WITH ABNORMAL CURRENT FLOW PREVENTION

This is a continuation of application Ser. No. 705,998, filed July 16, 1976, now abandoned.

This invention relates to a complementary MOSFET (hereinafter called CMOS) device in which abnormal current is prevented from being generated by parasitic bipolar transistors.

Hitherto various circuits constituted by CMOS's have been known. A typical example is a CMOS inverter circuit. As well known, a CMOS inverter circuit is constituted by a p-channel MOS transistor and an n-channel MOS transistor. The threshold voltage of one of these MOS transistors has the opposite characteristics to that of the other MOS transistor. For this reason, generally only one of the two MOS transistors is switched on in reponse to input information. Thus no current flows between the power sources of the CMOS inverter circuit, except during the transient period of the input information pulse. Thus, almost no operation power needs to be consumed, except that during the transient period of the pulse, both MOS transistors are switched on but for a moment, thereby causing only a transient current for a moment, that a leak current occurs at the PN junction, and that a current flows due to charge or discharge of a storage capacitor at the output terminal of the CMOS inverter circuit.

However, when noise is applied impulsively to the output or input of such a CMOS circuit system, an abnormally large DC current of tens of mA to hundreds of mA flows between the positive and negative power sources of the CMOS circuit. Even after removing the noise, such abnormal current is observed to keep flowing regularly. This regular flow of the abnormally large current sometimes causes the CMOS circuit connection to be melted and thus cut. The impulse corresponding to the noise has both polarities, positive and negative, and serves to generate an abnormal current. To remove this abnormal current it is necessary either to lower the power source voltage below a specific value or to disconnect the CMOS circuit system from the power source.

Accordingly, an object of the invention is to provide a CMOS device in which an abnormally large current is prevented from being generated by impulse noise and thus from flowing.

Another object of the invention is to provide a CMOS device in which the circuit connection is never melted nor cut even if impulse noise is applied.

Still another object of the invention is to provide a CMOS device which can keep operating with a low power consumption even if an impulse noise signal is applied.

A further object of this invention is to provide a CMOS semiconductor device capable of absorbing external noises by a power supply section or the signal input terminal of said device, thereby preventing the occurence of the absormal current in the semiconductor device even if the product of the current amplification factors of the two parasitic bipolar transistors formed in the semiconductor device is more than 1.

According to an aspect of this invention, there is provided a CMOS FET semiconductor device, which comprises a semiconductor substrate of one conductivity type; a well layer of the opposite conductivity type formed in said one conductivity type semiconductor substrate; a one channel type MOS transistor provided in said semiconductor substrate; and an MOS transistor of the opposite conductivity type formed in the well layer, wherein a capacitor for absorbing impulse noises acting as a trigger pulse for a thyristor circuit formed of a parasitic bipolar transistor produced in the semiconductor device and well layer is provided between the ground and the input or output terminals of the MOS transistors or at the power supply section.

This invention can be more fully understood from the following detailed description when taken in conjunction with the accompanying drawings, in which:

FIG. 1 schematically shows an inverter circuit formed of CMOS FET;

Figure 2:
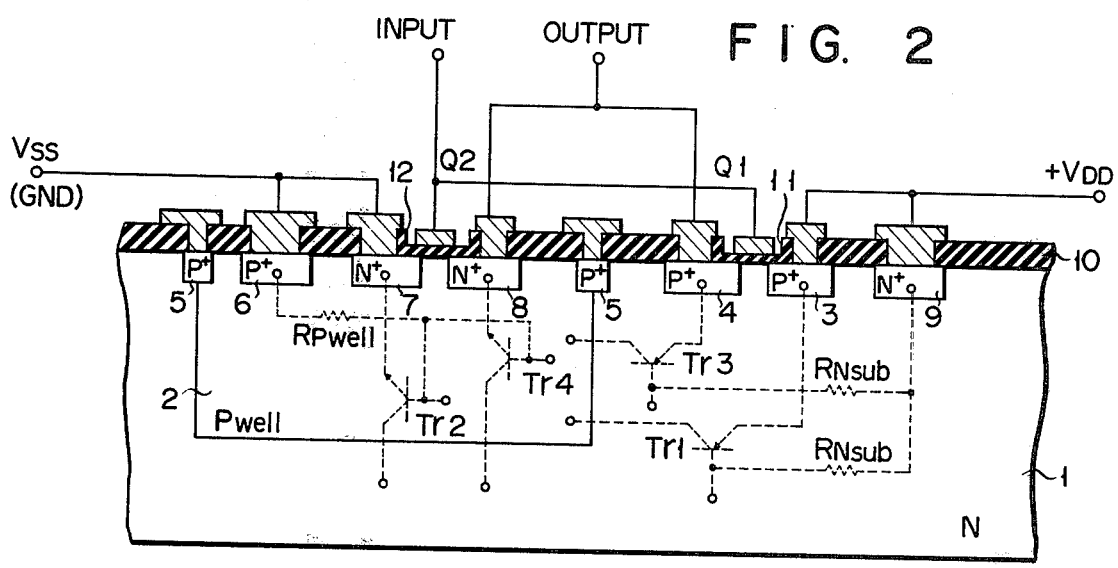
FIG. 2 is a cross sectional view of a CMOS FET device of this invention.

FIG. 4 schematically presents a circuit arrangement of a CMOS FET device according to an embodiment of the invention;

FIG. 5 schematically sets forth a circuit arrangement of a CMOS FET device according to another embodiment of the invention;

FIG. 6 is fractional cross sectional view of the proximity of the $V_{DD}$ terminal of the CMOS FET device of FIG. 2; and FIG. 7 is a block circuit diagram of a CMOS FET device according to still another embodiment of the invention.

The invention shall now be explained in detail with reference to the accompanying drawings.

Figure 1:
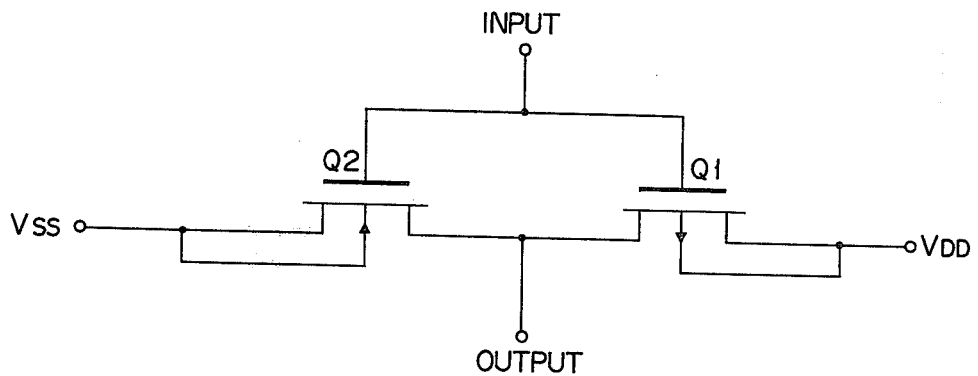

The CMOS inverter circuit illustrated in FIG. 1 is comprised of a p-channel MOS transistor $Q_1$ and n-channel MOS transistor $Q_2$. The source electrode of the MOS transistor $Q_1$ is connected to the positive power source $V_{DD}$, while the drain electrode thereof is connected to the output terminal, jointly with the drain electrode of the MOS transistor $Q_2$. The source electrode of the MOS transistor $Q_2$ is connected to the negative power source $V_{SS}$. The gate electrodes of the MOS transistors $Q_1$ and $Q_2$ are coupled to each other so as to form the input terminal of the CMOS inverter circuit.

FIG. 2 shows one embodiment of the semiconductor device according to the invention, wherein the CMOS inverter circuit shown in FIG. 1 is formed in a semiconductor wafer. The substrate 1 of the embodiment is an N type silicon substrate with an N type impurity, for example phosphorus, doped in concentration of about $1 \times 10^{15}$ atoms/cm$^3$. From the surface of the N type silicon substrate 1 a P type impurity, for example boron, is diffused into a portion of the substrate 1 in concentration of about $2 \times 10^{16}$ atoms/cm$^3$, thereby forming a P well layer 2. Further, boron is diffused into the N type substrate 1, the P well layer 2 and the junction edges between the N type substrate 1 and the P well layer 2, in concentration of about $10^{19}$ atoms/cm$^3$, thereby simultaneously forming in the N type substrate 1 a P+ type source region 3 and a P+ type drain region 4 which constitute a p-channel MOS transistor $Q_1$, a P+ type conductive coupling region 6 in the P well layer, and P+ type guard rings 5 in the junction edges between N type substrate 1 and the P well layer 2. Therefore, phosphorus is diffused into the P well layer 2 and the N type substrate 1 in concentration of about $10^{20}$ atoms/cm$^3$, thereby forming simultaneously an N+ type source region 7 and an N+ type drain region 8 which constitute an n-channel MOS transistor $Q_2$ in the P well layer 2 and an N+ type conductive coupling region 9 in the N type substrate 1. This done, the field silicon oxide 10 is formed on the entire surface of the substrate 1.

Thereafter, in order to form gate regions of the MOS transistors $Q_1$ and $Q_2$, photo-etching is conducted on the substrate 1, thereby making holes in the field oxide film 10. At the bottoms of these holes gate oxide films 11 and 12 having a thickness of 1500 Å are formed by oxidizing the holes at a high temperature. Then in order to effect such a circuit connection as shown in FIG. 1, contact holes of predetermined sizes are bored in the silicon oxide film 10, and a conductive film of, for example, aluminum is deposited all over the surface of the substrate 1. The conductive film is then cut in a specific pattern so as to connect the P+ type drain region 4 and the N+ type drain region 8 to each other and connect the gate regions (or oxide films) 11 and 12 to each other. Thus, the drain regions 4 and 8 form an output terminal, and the gate regions 11 and 12 an input terminal. At the same time the P+ type conductive coupling region 6 and the N+ type conductive coupling region 9 are connected to the negative power source $V_{SS}$ (ground) and the positive power source $V_{DD}$, respectively. Further, if necessary, a silicon oxide film may be laid by chemical epitaxial growth on the entire surface, except for desired portions, of the aluminum conductive film so as to protect the aluminum conductive film and enhance the reliability of the semiconductor device. Though not shown in FIG. 2, a stopper may be disposed between the MOS transistors $Q_1$ and $Q_2$.

When noise is applied impulsively to the output or input of the semiconductor device which is so constituted as mentioned above and which serves as a CMOS inverter circuit, an abnormal current of 10 mA to 100 mA does flow. The inventors of the present invention have closely observed and studied this phenomenon. Finally the inventors have found out that when an impulse noise current is applied to the semiconductor device, a specific thyristor circuit is formed in the semiconductor device, as depicted by dotted lines in FIG. 2. Namely, four kinds of parasitic bipolar transistors are formed in the semiconductor substrate 1. More specifically, a PNP lateral transistor $Tr_1$, whose emitter, base and collector are the source region 3 of the p-channel MOS transistor $Q_1$, the N type semiconductor substrate 1 and the P well layer 2, respectively, is formed in the direction parallel to the surface of the substrate 1. An NPN vertical transistor $Tr_2$, whose emitter, base and collector are the N+ type source region 7 of the n-channel MOS transistor $Q_2$, the P well layer 2 and the N type semiconductor substrate 1, respectively, is formed in the direction perpendicular to the surface of the substrate 1. Similarly, a PNP lateral transistor $Tr_3$, whose emitter, base and collector are the P+ type drain region 4 of the p-channel MOS transistor $Q_1$, the N type semiconductor substrate 1 and the P well layer 2, respectively, is formed in the direction parallel to the surface of the substrate 1. And an NPN vertical transistor $Tr_4$, whose emitter, base and collector are the N+ type drain region 8 of the n-channel MOS transistor $Q_2$, the P well layer 2 and the N type semiconductor substrate 1, respectively, is formed in the direction perpendicular to the surface of the substrate 1.

In the semiconductor device shown in FIG. 2 the collectors of the lateral transistors $Tr_1$ and $Tr_3$ and the bases of the vertical transistors $Tr_2$ and $Tr_4$ are constituted commonly by the P well layer 2. Thus, they are connected to one another and to the negative power source $V_{SS}$ (that is, grounded) through a resistance $R_{P\ well}$ and the P+ type conductive coupling region 6 both formed in the P well layer 2. On the other hand, the bases of the lateral transistors $Tr_1$ and $Tr_3$ and the collectors of the vertical transistors $Tr_2$ and $Tr_4$ are constituted commonly by the semiconductor substrate 1. They are therefore connected together and to the positive power source $V_{DD}$ through a resistance $R_{Nsub}$ and the N+ type conductive coupling region 9 both formed in the semiconductor substrate 1. Further, the emitters of the transistors $Tr_3$ and $Tr_4$ are connected to the output terminal OUTPUT, and the emitters of the transistors $Tr_1$ and $Tr_2$ are connected to the positive power source $V_{DD}$ and the negative power source $V_{SS}$, respectively.

Figure 3:
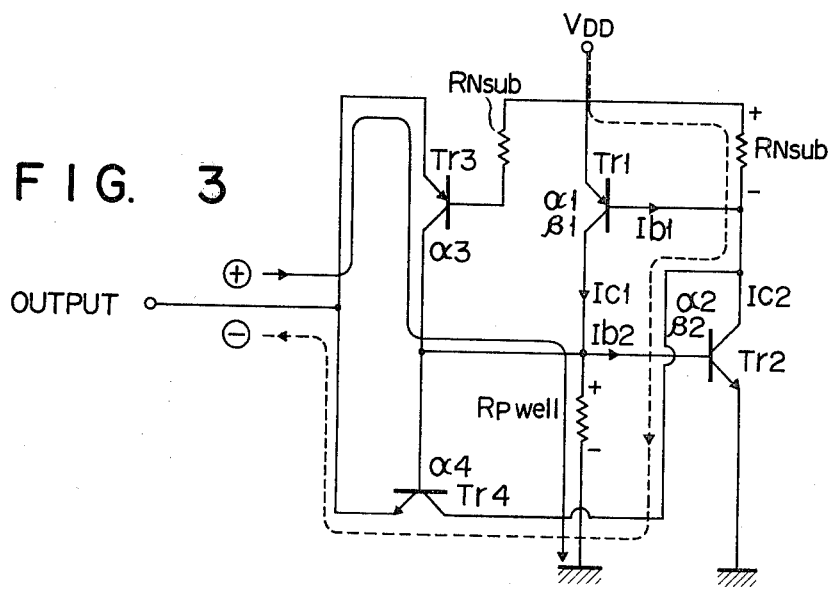
FIG. 3 is an equivalent circuit diagram of a thyristor formed in the CMOS FET device.

The connection of the lateral and vertical transistors being as such, the thyristor circuit formed in the CMOS circuit device of FIG. 2 and indicated in dotted lines in FIG. 2 can be expressed as such an equivalent circuit as illustrated in FIG. 3. With reference to FIG. 3, it shall be explained how the thyristor formed in the CMOS circuit device shown in FIG. 2 operates. In the following explanation, "$\alpha$" denotes a current amplification factor which is a bipolar transistor term generally employed to mean the ratio of collector current to the emitter current, "$\beta$" a current amplification factor, i.e. the ratio of the collector current to the base current ($\beta = \alpha/1-\alpha$), and "I" current. Similarly, "e", "b" and "c" stand for emitter, base and collector, respectively, and employed as suffix signs. Further, suffix numerals are used thereby to denote the transistors indicated by the corresponding numerals. In addition "r" is employed to denote the internal resistance of each transistor.

In FIG. 3, when a positive impulse noise current $I_{in}$ is applied to the output terminal as shown by the solid arrow, current of $\alpha_3 \times I_{in}$ flows in the collector of the transistor $Tr_3$. The current of $\alpha_3 \times I_{in}$ then flows through the resistance $R_{P\ well}$ of the P well layer 2, which serves as a by-pass. When the voltage across the resistance becomes over the threshold voltage $V_{bc2}$ between the base and emitter of the transistor $Tr_2$, the transistor $Tr_2$ is rendered conductive, and base current $I_{b2}$ flows through its base. The resistance $R_{P\ well}$ in the P well layer is far greater than the internal resistance $rbe2$ between the base and emitter of the transistor $Tr_2$. For this reason, the collector current $\alpha_3 \times I_{in}$ of the transistor $Tr_3$ hardly flows through the resistance $R_{P\ well}$. Consequently, the base current $I_{b2}$ of the transistor $Tr_2$ is almost equal to the collector current $\alpha_3 \times I_{in}$ of the transistor $Tr_3$. Namely, $$I_{b2} \approx \alpha_3 I_{in} (R_{Pwell} > > rbe2) \qquad (1)$$

$$I_{c2} = \beta_2 I_{b2} = \beta_2 \alpha_3 I_{in} \qquad (2)$$

Similarly, when the collector current $I_{c2}$ of the transistor $Tr_2$ acts as drive current and the voltage at both terminals of the resistance $R_{Nsub}$ of the substrate rises to the threshold voltage $V_{be1}$ between the base and emitter of the transistor $Tr_1$, the transistor $Tr_1$ is rendered conductive. Thus a base current $I_{b1}$ flows through the base of the transistor $Tr_1$. The base current $I_{b1}$ is nearly equal to the collector current $I_{c2}$ of the transistor $Tr_2$ since the resistance of $R_{Nsub}$ is extremely greater than the internal resistance $rbe1$ between the base and emitter of the transistor $Tr_1$. That is, ti $I_{b1} \simeq I_{c2}(R_{Nsub} >> rbe1)$ (3)

$I_{c1} = \beta_1 I_{b1} = \beta_1 I_{c2} = \beta_1\beta_2\alpha_3 I_{in}$ (4)

When the bipolar transistors $Tr_1$ and $Tr_2$ are made conductive, current flows between the positive power source $V_{DD}$ and the ground through these transistors $Tr_1$ and $Tr_2$. In other words, when an impulse noise is applied to the CMOS inverter circuit, an abnormal current flows between the positive power souce $V_{DD}$ and the ground through the semiconductor substrate 1 and the P well layer 2.

To keep a current flow between the positive power source $V_{DD}$ and the ground even after the noise application is stopped, it is required that the loop circuit constituted by the transistors $Tr_1$ and $Tr_2$ should perform a positive feedback operation. This is achieved only if the base current $I_{b2}$ of the transistor $Tr_2$ which is rendered conductive first when the impulse noise is applied is made equal to or smaller than the collector current $I_{c1}$ of the transistor $Tr_1$ which is rendered conductive after the transistor $Tr_2$. That is, $I_{b2} \leq I_{c1}$ (5)

Namely, $I_{b2} = \alpha_3 I_{in} \leq \beta_1\beta_2\alpha_3 I_{in}$

Therefore, $1 \leq \beta_1\beta_2$ (6)

From formula (6) it is understood that when the product of the current amplification factors $\beta_1$ and $\beta_2$ of the transistors $Tr_1$ and $Tr_2$ is equal to or larger than 1, an abnormal current keeps flowing between the positive power source $V_{DD}$ and the ground of the CMOS inverter circuit.

So long as the product of $\beta_1$ and $\beta_2$ is larger than 1, in the loop circuit including the transistors $Tr_1$ and $Tr_2$ the base current $I_{b2}$ in a specific cyclic period becomes greater than the base current $I_{b2}$ in the preceding cyclic period. Thus, the more times the current flows cyclically in the loop circuit, the greater the current between the power source $V_{DD}$ and the ground becomes. But the current does not increase indefinitely. The current amplification factor $\beta$ of a transistor is a function of the current, and its value increases with the current. However, it starts growing smaller when it has reached a maximum value, $\beta$ max. For this reason, the abnormal current flowing between the positive power source $V_{DD}$ and the ground of the CMOS inverter circuit is eventually maintained at a specific value, i.e. point of balance between the current increase effected by the loop circuit and the current decrease achieved by the reduction of current amplification factor. Namely, usually the abnormal current comes to have such a value as is defined when the following two conditions are satisfied at the same time:

$I_{b2}(n-1) = I_{b2}(n)$  a.

$\beta_1(n) \cdot \beta_2(n) \geq 1$,  b.

where "n" denotes the number of cyclic periods during which the abnormal current flows in the loop circuit.

The size of a transistor does not make a primary factor of the possibility of an abnormal current flow. But when the current amplification factor $\beta$ of the transistor was measured with the size of the transistor (strictly speaking, the drain area) as parameter, it was ascertained that there existed an interrelationship between the size of the transistor and the current value at which the abnormal current was finally maintained. This fact indicates that the larger is the drain area of a transistor, the greater is the abnormal current.

When a negative impulse noise is applied to the output of the CMOS inverter circuit as shown in FIG. 3, such current as indicated by the dotted-line arrow flows between the positive power source $V_{DD}$ and the output terminal OUTPUT, and the following formulas are established similarly as in case a positive impulse noise is applied to the output terminal:

$I_{b1} \simeq \alpha_4 I_{in}(R_{Nsub} \geq re1)$ (7)

$I_{c1} = \beta_1 I_{b1} = \beta_1\alpha_4 I_{in}$ $I_{b2} = I_{c1}(R_{Pwell} >> rbe2)$ and $I_{c2} = \beta_2 I_{b2} = \beta_2\beta_1 I_{b1} = \beta_1\beta_2\alpha_4 I_{in}$ To maintain current in the circuit constituted by the transistors $Tr_1$ and $Tr_2$ it is required that the collector current $I_{c2}$ of the transistor $Tr_2$ which is rendered conductive after the transistor $Tr_1$ should be greater than the base current $I_{b1}$ of the transistor $Tr_1$. That is, $I_{b1} \leq I_{c2}$ (8)

In order to maintain an abnormal current in the CMOS inverter circuit in case a negative noise is applied thereto, it is required as in case a positive noise is applied that the following formula be established:

$1 \leq \beta_1\beta_2$ (6)

The present inventors have provided circuit means, which can eliminate the formation of a thyristor circuit in the CMOS FET semiconductor device thereby to suppress the occurrence of abnormal current, even where a product of the amplification factors $\beta_1$, $\beta_2$ of bipolar transistors parasitically formed in the CMOS FET device is larger than 1.

According to a first embodiment of this invention of FIG. 4, a capacitor 22 is connected between the output terminal OUT of a CMOS FET circuit 21, for example, a CMOS inverter shown in FIG. 1 and the ground or power source. When connected to another circuit, the output terminal OUT of the CMOS FET circuit 21 is disturbed by an impulse noise signal sent forth from said another circuit. In this case, the capacitor 22 absorbs the impulse noise signal. A noise causing a thyristor phenomenon is generally an impulse noise, and has a larger absolute value, positive or negative, than the voltage level of an output signal from the CMOS semiconductor device, and is unfailingly absorbed by the capacitor 22 which is charged or discharged according to the voltage level of said output signal.

FIG. 5 shows a CMOS semiconductor device according to another embodiment of this invention. Protection diodes 23, 24 of the opposite polarity to power source voltage are connected between the MOS transistors $Q_1$, $Q_2$ of the CMOS inverter circuit. An input signal having higher voltage than prescribed is not carried to the gates of the MOS transistors $Q_1$, $Q_2$, but is by-passed to the power source through the protective diodes 23, 24, thereby protecting the MOS transistors $Q_1$, $Q_2$. Where, however, an impulse noise signal received at the input terminal IN of the CMOS FET device is carried to the power source $V_{DD}$ or $V_{SS}$ through the diodes 23, 24 to be introduced into the semiconductor substrate or well layer, giving rise to the thyristor circuit in the input terminal IN. Where, therefore, the protective diodes 23, 24 are also provided on the input side of the MOS circuit 21, capacitor 22 is connected between the input terminal IN and the ground (or power source) to absorb the impulse noise signal.

FIG. 6 shows the power source $V_{DD}$ of the CMOS semiconductor device. The source region 3 and $N^+$ contact region 9 of the MOS transistor $Q_1$ are provided in the N type semiconductor substrate 1. As previously mentioned, these regions 3, 9 are connected to the power source $V_{DD}$ through an electrode film 13 made of, for example, aluminium. Where the power source $V_{DD}$ is impressed with voltage, then the emitter (source region) 3 of a parasitic bipolar transistor $Tr_1$ is supplied with voltage $+V_{DD}$, and the base of said parasitic bipolar transistor $Tr_1$ is impressed with the voltage which is determined by the resistance $R_{Nsub}$ occurring according to the impurity concentration of the N type semiconductor substrate. Thus, the parasitic bipolar transistor $Tr_1$ is rendered conductive and presents a thyristor phenomenon with the resultant appearance of abnormal current. To suppress the abnormal current, the capacitor 22 is connected, as shown in FIG. 7, in parallel to a power source 25. When the power source 25 is put into operation, the capacitor 22 extends the transient period with regard to the power source voltage and also absorbs any impulse noise signal. Further, where provided in the power source section, the capacitor 22 prevents another parasitic bipolar transistor $Tr_2$ from being rendered conductive, and further absorbs general noises carried from the power source 25. The capacitor 22 may be incorporated in an integrated circuit constituting the CMOS semiconductor device or may be used as an external element. For absorption of impulse noise signals, the capacitor 22 has its capacity determined according to the level of voltage impressed on the power source 25.

This invention is not limited to the foregoing embodiments, but is also applicable to various forms of other CMOS circuits than the inverter circuit in which a thyristor circuit is formed. Further, the CMOS circuit used in this invention may be formed by providing an N well layer in a P type semiconductor device.

As mentioned above, the CMOS semiconductor device of this invention has the input or output terminal or power supply section provided with a capacitor and can absorb impulse noise signals giving rise to a thyristor phenomenon with the resultant appearance of abnormal current. Therefore, even where a product of the amplification factors $\beta_1$, $\beta_2$ of two parasitic bipolar transistors $Tr_1$ and $Tr_2$ is larger than 1, the CMOS semiconductor device of this invention can suppress the occurrence of abnormal current. Accordingly this semiconductor device consumes a smaller amount of power than required in the past and is saved from the melt breakage of circuit connection.

What we claim is:

1. In an integrated semiconductor circuit biased by a power source and including a CMOS FET device which comprises a first region of one conductivity type; a second region of the opposite conductivity type formed in the first region; a one channel type MOS transistor formed in that portion of the first region which lies outside of the second region; and an MOS transistor of the opposite channel type provided in the second region, said MOS transistors each having a source and a drain, said power source being selectively coupled in step fashion to one of said sources and drains and to the region in which said one of said sources and drains is formed to bias said CMOS FET device, said device including a potential thyristor circuit formed of parasitic bipolar transistors with one of said parasitic bipolar transistors including said one of said sources and drains, said thyristor circuit establishing current flow from said power source through said first and second regions upon application of said power source due to biasing as a result of a delay before said region in which said one source and drain is formed reaches the full potential of said power source, the improvement comprising:

capacitor means for delaying the rise in potential of said one source and drain upon application of said power source enough to reduce the instantaneous difference between the potential of said one source and drain and the potential of said one region sufficient to prevent conduction of said one of said parasitic bipolar transistors, said capacitor means being coupled in parallel to said power source and said capacitor means also being provided to absorb impulse noise signals acting as a trigger pulse for said thyristor circuit.

* * * * *